United States Patent [19]

Beck et al.

[11] Patent Number: 4,507,160
[45] Date of Patent: Mar. 26, 1985

[54] IMPURITY REDUCTION TECHNIQUE FOR MERCURY CADMIUM TELLURIDE

[75] Inventors: Jeffrey D. Beck, Plano; Herbert F. Schaake, Denton; John H. Tregilgas, Richardson; Michael A. Kinch, Dallas, all of Tex.

[73] Assignee: Texas Instruments Incorporated, Dallas, Tex.

[21] Appl. No.: 564,871

[22] Filed: Dec. 23, 1983

[51] Int. Cl.³ ................ H01L 21/324; H01L 21/385
[52] U.S. Cl. .................... 148/191; 148/1.5; 156/DIG. 66; 156/DIG. 72; 156/DIG. 82
[58] Field of Search .................. 148/191, 1.5; 156/DIG. 66, DIG. 72, DIG. 73, DIG. 82

[56] References Cited

U.S. PATENT DOCUMENTS

| 3,954,518 | 5/1976 | Schmit et al. | 148/20.3 |
| 3,963,540 | 6/1976 | Camp, Jr. et al. | 148/20.3 |
| 4,116,725 | 9/1978 | Shimizu | 148/20.3 |
| 4,318,217 | 3/1982 | Jenner et al. | 29/572 |
| 4,435,224 | 3/1984 | Durand | 148/1.5 |

Primary Examiner—Aaron Weisstuch
Attorney, Agent, or Firm—Robert Groover; James T. Comfort; Melvin Sharp

[57] ABSTRACT

The disclosure relates to a method for reducing impurity concentration in mercury cadmium telluride alloys wherein impurities are attracted to a region saturated with second phase tellurium during annealing in a saturated mercury atmosphere where the second phase tellurium and the impurities attracted thereto can be removed by polishing, etching, grinding, or the like.

24 Claims, 4 Drawing Figures

POST ANNEAL

IMPURITY REDUCTION TECHNIQUE FOR MERCURY CADMIUM TELLURIDE

BACKGROUND OF THE INVENTION

1. Field of the Invention

This invention relates to the preparation of semiconductor alloys having the general formula $Hg_{(1-x)}Cd_xTe_1$ [where "X" is in the range of from about 0.14 to about 0.40 for infrared applications] generally referred to as "HgCdTe".

2. Description of the Prior Art and Background

Alloys containing mercury, cadmium and tellurium and having the general formula set forth hereinabove have been extensively reported in the prior art, particularly in conjunction with their semiconductor properties and their use in the area of infrared detectors and the like. A principal requirement of these materials is low concentration of impurities, the ideal concentration preferably being less than $10^{14}/cm^3$. It has, however, been difficult to obtain extrinsically doped P-type material with acceptor concentrations below about $10^{15}/cm^3$.

Fast diffusing acceptor impurities have been shown to preferentially segregate in regions of the mercury cadmium telluride sample which contain second phase tellurium. The area containing second phase tellurium is normally at the core or central region of the alloy slice. The reason is that, after a mercury cadmium telluride ingot has been formed in standard manner, it is then recrystallized and homogenized in a high temperature annealing step and then post-annealed at preferably low temperature for the normal post-annealing period of about one to four weeks. Such post-anneal normally results in an N-type skin free of excess Te and a core saturated with second phase tellurium. Mobile residual impurities in the alloy segregate to the "core" of the second phase tellurium at the center of the slice or slab. When the second phase tellurium is then removed or annihilated by a further post-annealing step as discussed in more detail in Ser. No. 564,953 filed Dec. 23, 1983, wherein the second post-anneal step is provided in a saturated mercury atmosphere at about 280° C. for a period of from about one up to about four weeks or longer to remove the excess second phase tellurium, and then redistribute residual acceptor impurities throughout the alloy material. The net result of these steps is to provide an alloy which is P-type with an acceptor concentration in a range of about $1-10 \times 10^{15}/cm^3$.

A fundamental barrier to obtaining extrinsically doped P-type material with acceptor concentrations below about $10^{15}/cm^3$ is the reduction of the residual acceptor impurity concentration. It is therefore necessary that a technique be provided which will result in the desired lower concentrations of impurity. To date, this problem has not been resolved satisfactorily. While it is recognized that the core region of the mercury cadmium telluride slice provides a gettering function to eliminate or minimize these impurities from the device region near the surface, it may also getter a desired dopant impurity. Therefore, gettering of the residual impurities must occur and be removed from the material prior to introduction of the dopants.

SUMMARY OF THE INVENTION

In accordance with the present invention, there is provided a method for reducing impurity concentration in mercury cadmium telluride alloy. The technique to be used exploits the segregation phenomenon noted wherein impurities are attracted to a region containing second phase tellurium during annealing in a saturated mercury vapor atmosphere by utilizing this phenomenon at the surface of the slice or slab where the second phase tellurium and the impurities attracted thereto can be removed by polishing, etching, grinding, or the like rather than at a core at the center of the slice.

An impurity reduction technique which utilizes the above noted concept and which circumvents the problems noted above in the prior art employs second phase tellurium generated at the surface of a mercury cadmium telluride slice by annealing the slice under a vacuum or in an unsaturated mercury vapor atmosphere. During vacuum annealing mercury will come out of the alloy material and go into the ambient atmosphere due to its unsaturated condition and crate a surface layer of second phase tellurium clusters. After removing the Te enriched surface from one side of the slice, additional post-annealing below about 300° C. will segregate the fast diffusing residual acceptor impurities to the side of the slice which remains Te saturated. These impurities will collect in the tellurium-rich surface region which can then be removed by etching, polishing or the like as noted above. More specifically, in this technique, the mercury cadmium telluride bar is processed in accordance with the techniques disclosed in Ser. No. 564,953 filed Dec. 23, 1983 or Ser. No. 444,903 filed Nov. 29, 1982 or the like. When the processing has reached the point just before the post-annealing step in the above noted applications, the mercury cadmium telluride bar will merely have impurities spread therethrough. The bar is then processed in a vacuum or unsaturated mercury atmosphere at a temperature in the range of from about 100° C. to just below the melting point of the slice or bar and is preferably performed at a temperature between about 100° C. and the melting point of tellurium which is about 449° C. Under these conditions, mercury will travel out of the bar and into the atmosphere and second phase tellurium will form about the surfaces of the bar. This action takes place because tellurium has a lower vapor pressure than does mercury, causing the mercury to volatilize first, leaving behind the second phase tellurium. The bar is then removed from the annealing process and the second phase tellurium layer is removed from one side or surface of the bar by grinding, etching, polishing or the like. The bar is again port-annealed, this time in a saturated mercury vapor for from about one day to about several weeks at a temperature below about 300° C. and preferably about 270° C. Under these conditions, some of the impurities remaining in the slab or bar will move by solid state diffusion to the Te saturated HgCdTe and adjacent second phase tellurium layer. This slab will again be processed by removing the remaining second phase tellurium layers by etching, polishing, grinding or the like, the removal of the second phase tellurium layers also including removal of the impurities which have substantially moved therein. The remaining material will be highly purified and have residual acceptor impurity concentrations below $10^{15}/cm^3$. If desired, a slice can be removed from the central portion of the above noted purified slab to increase the certainty that a sufficient number of the excess impurities have been removed therefrom.

An alternative method to generate second phase Te preferentially on one side of a HgCdTe slab, which could then be used for gettering, is decomposition using a selective surface irradiation such as with a laser, halogen lamp, or an electron or ion beam. Placing a slab of HgCdTe in vacuum chamber with a transparent window and optically irradiating the sample by selectively heating one side to much higher temperature than its backside, would induce Hg to evaporate from this surface. This decomposed surface would then contain second phase Te.

Generation of the second phase Te at the surface by in situ decomposition avoids contamination problems which might result from deposited Te layers.

DESCRIPTION OF THE PREFERRED EMBODIMENT

Figure 1:
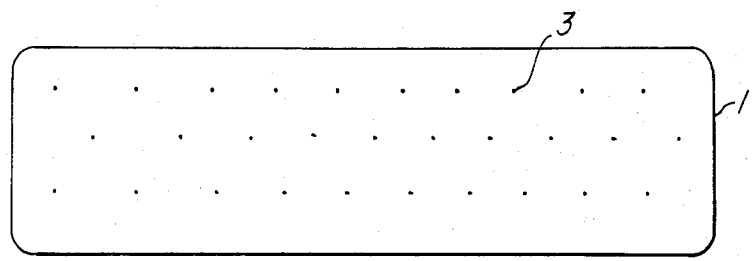
FIG. 1 is a cross-sectional schematic diagram of a HgCdTe slice with second phase tellurium removed therefrom.

Referring first to FIG. 1, there is shown a HgCdTe slice 1 with acceptor impurities 3 substantially homogeneously dispersed therein at a high concentration of about $5 \times 10^{15}/cm^3$. The slice 1 as shown in FIG. 1 is formed in a standard manner such as by forming a HgCdTe ingot in a quartz ampoule by heating appropriate proportions of each of the metals mercury, cadmium, and tellurium therein with an excess of tellurium to a temperature in excess of 800° C. until a liquid is formed and retaining the temperature for about half a day. The liquid is then shaken to distribute the contents in the ampoule and the ampoule is quenched with nitrogen to provide a solid ingot therein. The ingot is then annealed for a period of about four weeks at a temperature in excess of 650° C. and below the melting point of the crystal to provide for recrystallization and homogenization thereof. The ingot is then cut into slices or slabs and post-annealed in a saturated mercury vapor atmosphere at a temperature of about 280° C. for a period sufficient to convert all second phase Te present in the sample to HgCdTe by the in-diffusing Hg, and subsequent homogenization with adjacent regions containing Cd. This post annealing step would normally require from two to in excess of twenty weeks depending on slice thickness and the annealing temperature. For example, a 20 mil slice can be expected to be completely annealed throughout in six weeks. The result is the structure as shown in FIG. 1.

In order to reduce the amount of fast diffusing impurities or dopants within the slice of FIG. 1, a high concentration of second phase Te is generated and predominantly confined to a single side of the slice, prior to post annealing an additional time in saturated Hg vapor, which causes the impurities to segregate to the Te saturated side of the slice. The segregated impurities may then be removed by an appropriate means, such as grinding or etching.

Figure 2:
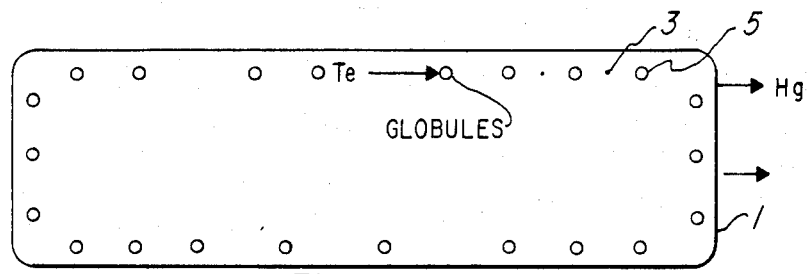
FIG. 2 is a view as in FIG. 1 after annealing of the slice of FIG. 1 in a vacuum or unsaturated mercury atmosphere; using a selective surface irradiation such as with a laser, halogen lamp, or an electron or ion beam.

The generation of a high concentration of second phase Te at the surface of the slice may be accomplished in a number of ways. The slice of FIG. 1 can be annealed either in a vacuum for a short period of time or in an atmosphere of Hg which is not saturated. This step is carried out at a temperature above 100° C. and below the melting point of the HgCdTe; however, temperatures near the melting point of Te which is about 449° C. are preferred. In this case, the Te rich region is generated on all surfaces of the slice, as shown in FIG. 2, which necessitates removal of a portion of the surface such as one side 7 (FIG. 3) prior to additional post annealing.

Figure 3:
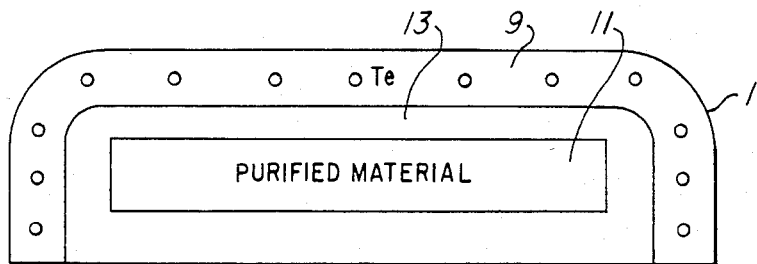
FIG. 3 is a schematic diagram of the slice of FIG. 2 after removal of the second phase tellurium layer from one surface thereof and further post-anneal.

Such surface removal can be achieved by grinding, polishing, etching, or the like to remove the layer of enriched second phase Te 9 present on that surface. The slice 1 will then appear as is shown in FIG. 3 after removal of the enriched second phase Te layer 9 from said one side 7.

An alternative method to achieve a single Te enriched surface, thereby obviating the need for removing one surface such as side 7 (FIG. 3), is selective heating of one surface by a suitable means such as laser or halogen lamp irradiation, or possibly electron or ion beam bombardment, while the sample is held in a vacuum. Such selective surface heating will cause an abundance of second phase Te to form on one side of the slab of HgCdTe, similar to that shown in FIG. 3.

Figure 4:
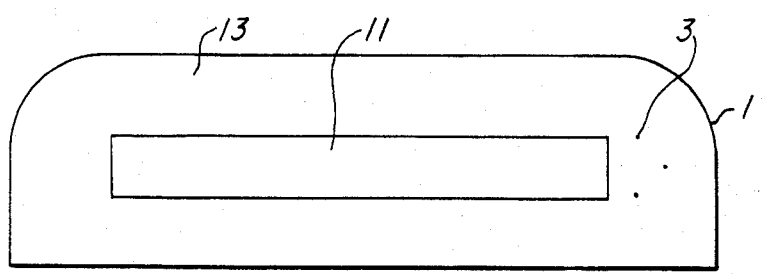
FIG. 4 is a schematic diagram of the slice of FIG. 3 after removal of all second phase tellurium layers at the surface.

The slice of FIG. 3 is then annealed again in a saturated mercury atmosphere at a temperature of less than 300° C., preferably about 280° C., for a period of from about one day to about four weeks to drive the randomly distributed impurities into the second phase tellurium region 9 as shown in FIG. 4. The region 9 is then removed by etching, polishing, grinding, or the like to remove the remainder of the second phase tellurium and any impurities that have migrated therein and leaving a region 11 with low impurity concentration. The resulting structure is shown in FIG. 4 wherein there is shown the remaining slice 1 which includes a lower concentration of impurities 3 therein and purified region 11 having an even lower impurity concentration.

It can be seen that there has been provided a simple technique which is capable of removing impurities including dopants to the degree desired from an HgCdTe member, the amount of impurity being removed depending upon temperature and time relationships as is well known in the art.

Through the invention has been described with respect to a specific preferred embodiment thereof, many variations and modifucations will immediately become apparent to those skilled in the art. It is therefore the intention that the appedned claims be interpreted as broadly as possible in view of the prior art to include all such variations and modifications.

What is claimed is:

1. A method of reducing the impurity level in impurity containing mercury cadmium telluride, comprising the steps of:
   (a) providing a slab of HgCdTe having impurities homogeneously distributed therein,
   (b) causing mercury to be removed from the surfaces of said slab to cause the surface layer of said slab to be tellurium-rich,
   (c) removing a portion of said tellurium-rich surface layer, (d) causing impurities in said slab to travel into the remaining portion of said tellurium-rich surface layer and (e) removing the remaining tellurium-rich surface layer from said slab.

2. A method as set forth in claim 1 wherein step (b) comprises annealing said slab at a temperature from about 100° C. to about the melting point of the HgCdTe in one of an evacuated atmosphere and an unsaturated mercury vapor atmosphere.

3. A method as set forth in claim 2 wherein step (d) comprises the step of annealing the product resulting from step (c) in a saturated mercury vapor atmosphere at a temperature below about 300° C. for a period of from about one day to four weeks.

4. A method as set forth in claim 3 wherein said slab after step (e) is substantially homogeneous.

5. A method as set forth in claim 2 wherein said slab after step (e) is substantially homogeneous.

6. A method as set forth in claim 1 wherein step (d) comprises the step of annealing the product resulting from step (c) in a saturated mercury vapor atmosphere at a temperature below about 300° C. for a period of from about one day to four weeks.

7. A method as set forth in claim 6 wherein said slab after step (e) is substantially homogeneous.

8. A method as set forth in claim 1 wherein said slab after step (e) is substantially homogeneous.

9. A method of reducing the impurity level in impurity containing mercury cadmium telluride, comprising the steps of:

(a) providing a slab of HgCdTe having impurities distributed therein, (b) causing a surface layer of said slab to be tellurium-rich, (c) removing a portion of said tellurium-rich surface layer, (d) causing impurities in said slab to travel into the remaining portion of said tellurium-rich surface layer, and (e) removing the remaining tellurium-rich surface layer from said slab.

10. A method as set forth in claim 9 wherein the tellurium formed in said surface layer in step (b) is second phase tellurium.

11. A method as set forth in claim 10 wherein step (b) comprises annealing said slab at a temperature from about 100° C. to about the melting point of HgCdTe in one of an evacuated atmosphere and an unsaturated mercury vapor atmosphere.

12. A method as set forth in claim 11 wherein step (d) comprises the step of annealing the product resulting from step (c) in a saturated mercury vapor atmosphere at a temperature below about 300° C. for a period of from about one day to four weeks.

13. A method as set forth in claim 12 wherein said slab after step (e) is substantially homogeneous.

14. A method as set forth in claim 11 wherein said slab after step (e) is substantially homogeneous.

15. A method as set forth in claim 10 wherein step (d) comprises the step of annealing the product resulting from step (c) in a saturated mercury vapor atmosphere at a temperature below about 300° C. for a period of from about one day to four weeks.

16. A method as set forth in claim 15 wherein said slab after step (e) is substantially homogeneous.

17. A method as set forth in claim 10 wherein said slab after step (e) is substantially homogeneous.

18. A method as set forth in claim 9 wherein step (b) comprises annealing said slab at a temperature from about 100° C. to about the melting point of HgCdTe in one of an evacuated atmosphere and an unsaturated mercury vapor atmosphere.

19. A method as set forth in claim 18 wherein step (d) comprises the step of annealing the product resulting from step (c) in a saturated mercury vapor atmosphere at a temperature below about 300° C. for a period of from about one day to four weeks.

20. A method as set forth in claim 19 wherein said slab after step (e) is substantially homogeneous.

21. A method as set forth in claim 18 wherein said slab after step (e) is substantially homogeneous.

22. A method as set forth in claim 9 wherein step (d) comprises the step of annealing the product resulting from step (c) in a saturated mercury vapor atmosphere at a temperature below about 300° C. for a period of from about one day to four weeks.

23. A method as set forth in claim 22 wherein said slab after step (e) is substantially homogeneous.

24. A method as set forth in claim 9 wherein said slab after step (e) is substantially homogeneous.

* * * * *